United States Patent
Tee et al.

(10) Patent No.: US 9,837,334 B2
(45) Date of Patent: Dec. 5, 2017

(54) PROGRAMMABLE ACTIVE COOLING DEVICE

(71) Applicant: GLOBALFOUNDRIES Singapore Pte. Ltd., Singapore (SG)

(72) Inventors: Kheng Chok Tee, Singapore (SG); Juan Boon Tan, Singapore (SG); Wei Liu, Singapore (SG); Kam Chew Leong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/673,843

(22) Filed: Mar. 30, 2015

(65) Prior Publication Data

US 2016/0293515 A1    Oct. 6, 2016

(51) Int. Cl.
| | | |
|---|---|---|
| *H01L 23/367* | (2006.01) | |
| *H01L 23/38* | (2006.01) | |
| *H01L 23/373* | (2006.01) | |
| *H01L 27/12* | (2006.01) | |
| *H01L 35/30* | (2006.01) | |

(Continued)

(52) U.S. Cl.
CPC ...... *H01L 23/3677* (2013.01); *H01L 21/7624* (2013.01); *H01L 23/3736* (2013.01); *H01L 23/3738* (2013.01); *H01L 23/38* (2013.01); *H01L 27/12* (2013.01); *H01L 27/1203* (2013.01); *H01L 35/30* (2013.01); *H01L 35/32* (2013.01); *H01L 23/367* (2013.01)

(58) Field of Classification Search
CPC ..... H01L 23/3677; H01L 27/16; H01L 23/38; H01L 35/32; H01L 35/30; H01L 35/28; H01L 35/325; H01L 23/3736; H01L 23/3738; H01L 27/1203; H01L 35/34

See application file for complete search history.

(56) References Cited

U.S. PATENT DOCUMENTS

| | | | | |
|---|---|---|---|---|
| 5,658,809 | A | * | 8/1997 | Nakashima ....... H01L 21/76243 257/E21.339 |
| 6,121,661 | A | * | 9/2000 | Assaderaghi ........... H01L 21/84 257/104 |

(Continued)

OTHER PUBLICATIONS

Emil Arnold et al., Comparison of Self-Heating Effects in Bulk-Silicon and SOI High-Voltage Devices, Electron Devices Meeting, IEDM '94. Technical Digest, International, Dec. 1994, pp. 813-816, IEEE, USA.

(Continued)

*Primary Examiner* — Daniel Luke
(74) *Attorney, Agent, or Firm* — Horizon IP PTE Ltd.

(57) ABSTRACT

Cooling devices for SOI wafers and methods for forming the devices are presented. A substrate having a top surface layer, a support substrate and an insulator layer isolating the top surface layer from the support substrate is provided. At least one device is disposed in the top surface layer of the substrate. The IC includes a cooling device. The cooling device includes a doped layer which is disposed in a top surface of the support substrate, and a RDL layer disposed within the support substrate below the doped layer for providing connections to hotspots in the doped layer to facilitate thermoelectric conduction of heat in the hotspots away from the hotspots.

20 Claims, 13 Drawing Sheets

(51) Int. Cl.
*H01L 35/32* (2006.01)
*H01L 21/762* (2006.01)

(56) References Cited

U.S. PATENT DOCUMENTS

| | | | | |
|---|---|---|---|---|
| 6,800,933 | B1* | 10/2004 | Mathews | H01L 23/38 257/467 |
| 2008/0102601 | A1* | 5/2008 | Bourdelle | H01L 21/76254 438/458 |
| 2008/0157141 | A1* | 7/2008 | Han | H01L 27/14645 257/292 |
| 2010/0019385 | A1* | 1/2010 | Bartley | H01L 21/76898 257/741 |
| 2010/0164093 | A1* | 7/2010 | Mowry | H01L 23/3677 257/706 |
| 2011/0104846 | A1* | 5/2011 | Hsu | H01L 23/481 438/54 |
| 2011/0291269 | A1* | 12/2011 | Griebenow | G06F 1/20 257/737 |
| 2015/0115431 | A1* | 4/2015 | Chadwick | H01L 23/38 257/712 |

OTHER PUBLICATIONS

Chandrakant D. Patel, Backside Cooling Solution for High Power Flip Chip Multi-Chip Modules, Electronic Components and Technology Conference, Proceedings, 44th, May 1994, pp. 442-449, IEEE, Washington, DC.

Tellurex, Frequently Asked Questions About Our Cooling and Heating Technology, "http://tellurex.com/wp-content/uploads/2014/04/peltier-faq.pdf", 2010, Tellurex Corporation.

Ci Pengliang et al., Peltier Effect in Doped Silicon Microchannel Plates, Journal of Semiconductors, Dec. 2011, vol. 32, No. 12, Chinese Institute of Electronics, China.

Gui-Ying Xu et al., Thermoelectric Properties on n-type Si80Ge20 with Different Dopants, International Conference on Thermoelectrics, 2006, IEEE.

* cited by examiner

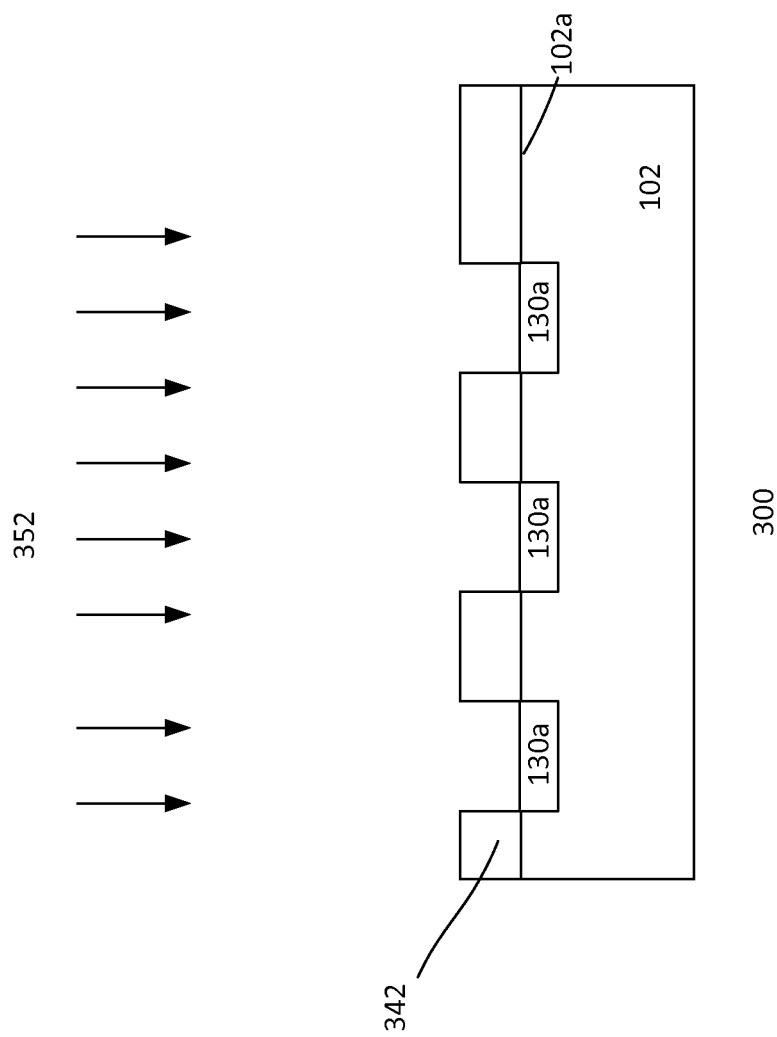

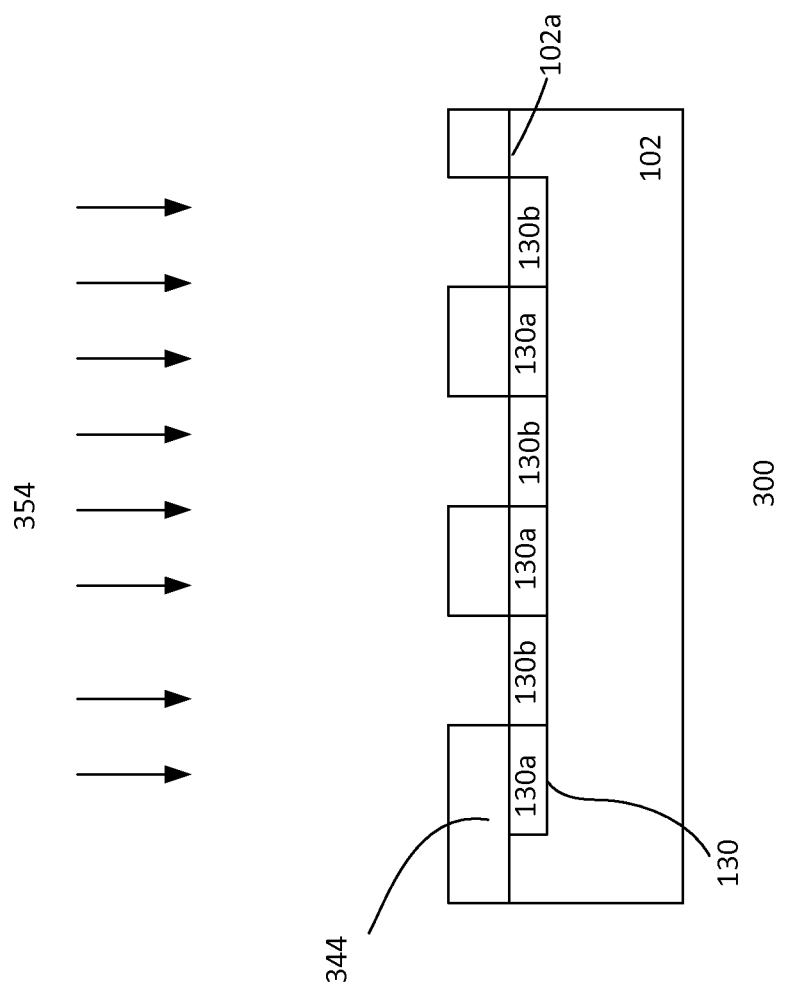

PROGRAMMABLE ACTIVE COOLING DEVICE

BACKGROUND

Some semiconductor devices employ silicon-on-insulator (SOI) substrate in place of conventional single layer semiconductor substrate in semiconductor manufacturing, especially in microelectronics, to reduce parasitic device capacitance such that device performance can be improved. SOI substrate includes a top silicon (Si) surface layer separated from a support or "handle" Si substrate by an insulator layer. The insulator layer includes, for example, silicon dioxide, and is usually referred to as the buried oxide (BOX) layer. Components or devices, such as transistors, are formed in the top Si surface layer and the insulator layer isolates the top Si surface layer from the support Si substrate.

The insulator layer of the SOI substrate is thermally insulative compared to semiconductor layers. Thus, as integrated circuit (IC) density grows, heat which would generally dissipate through the conventional bulk substrate will not dissipate through the insulator layer and tends to build up in the top Si surface layer. This self-heating effect of SOI substrate undesirably affects the performance and reliability of the IC. Cooling systems are applied to cool down the device. However, conventional cooling systems for SOI substrates apply by large area, i.e., cooling the entire substrate or an entire module, which results in electricity wastage.

The disclosure is directed to a programmable active cooling device for the SOI substrate that cools just the hot spots on the substrate to reduce usage of electricity and achieving cost savings.

SUMMARY

Embodiments generally relate to cooling devices for SOI wafers and methods for forming such device.

In one embodiment, an integrated circuit (IC) having a substrate is disclosed. The substrate includes a top surface layer, a support substrate and an insulator layer isolating the top surface layer from the support substrate. At least one device is disposed in the top surface layer of the substrate. The IC includes a cooling device. The cooling device includes a doped layer which is disposed in a top surface of the support substrate, and a RDL layer disposed within the support substrate below the doped layer for providing connections to hotspots in the doped layer to facilitate thermoelectric conduction of heat in the hotspots away from the hotspots.

In another embodiment, a method for forming an integrated circuit (IC) is presented. The method includes providing a support substrate having a top surface. A doped layer is formed in the top surface of the support substrate. An insulator layer is formed over the top surface of the support substrate. A top surface layer is formed on the insulator layer. The top surface layer includes at least a device. The method also includes forming a redistribution layer (RDL) for connecting to hotspots in the doped layer to facilitate thermoelectric conduction of heat in the hotspots away from the hotspots.

In yet another embodiment, a method for cooling an IC is presented. The method includes providing a silicon-on-insulator (SOI) substrate. A cooling device is formed in a support substrate that is located at the back of a top surface layer of the SOI substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 3a-3g show cross-sectional views of an embodiment of a process for forming an IC with the cooling device of FIGS. 1a-1b.

DETAILED DESCRIPTION

Embodiments generally relate to cooling devices for SOI substrates in ICs and methods for forming such devices. The cooling devices are active and programmable and cool only the hotspots on SOI substrates in the ICs. The ICs can be incorporated into or used with, for example, consumer electronic products, particularly portable consumer products, such as cell phones, laptop computers and personal digital assistants (PDAs) or other types of devices.

Figure 1A:
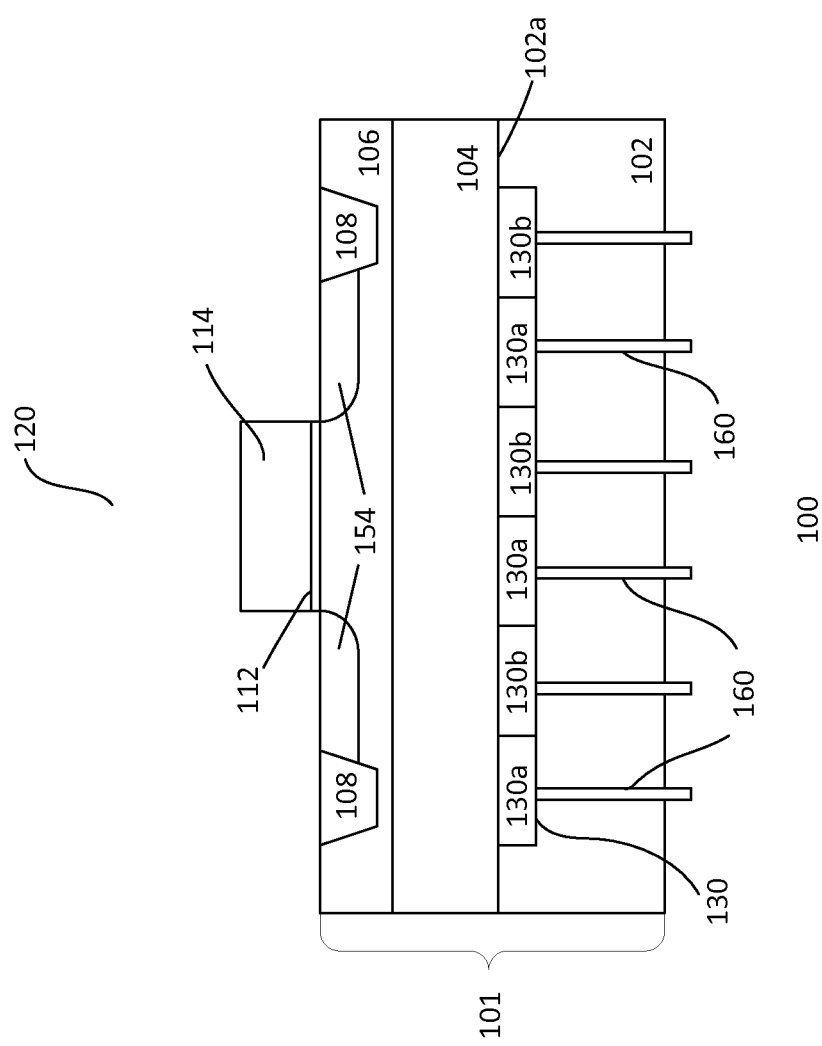
FIG. 1a shows a cross-sectional view of an embodiment of an IC and FIG. 1b shows a simplified top view and cross-sectional view of an embodiment of a cooling device of the IC.

FIG. 1a shows a simplified cross-sectional view of an embodiment of a device 100, such as an IC. Other types of devices may also be useful. As shown, the device includes a substrate 101. The substrate, for example, includes a top surface layer 106 separated from a support or "handle" substrate 102 by an insulator layer 104. The support substrate, for example, may be lightly doped with first polarity type dopants, such as p-type dopants. Providing a support substrate which is lightly doped with second polarity type dopants, such as n-type dopants, may also be useful. P-type dopants may include boron (B), aluminum (Al), indium (In) or a combination thereof, while n-type dopants may include phosphorous (P), arsenic (As), antimony (Sb) or a combination thereof.

The insulator layer 104, for example, includes a dielectric insulating material. The insulator layer, for example, is formed from silicon oxide, providing a buried oxide (BOX) layer. Other suitable types of dielectric insulating materials may also be useful. The thickness of the insulator layer, for example, is about 1500 angstrom (Å). Other suitable thicknesses and materials for the insulator layer 104 may also be useful.

The top surface layer 106 of the substrate 101, as shown in FIG. 1a, includes a semiconductor material. The semiconductor material, for example, includes single crystalline Si. In this case, the top surface layer 106 may be referred to as the top Si layer and the substrate 101 is a silicon-on-insulator (SOI) substrate. Other suitable types of substrate materials or any other suitable semiconductor materials may also be useful. In one embodiment, the top surface layer and the support substrate include the same material. The top surface layer 106 and the support substrate 102 may also include different materials.

As shown in FIG. 1a, the device 100 includes a transistor 120 disposed in the top surface layer 106. The transistor 120 includes a gate between first and second source/drain (S/D) regions 154. The gate, for example, includes a gate electrode layer 114 over a gate dielectric layer 112. The transistor may be disposed in a device region. The device region may be isolated from other regions by an isolation region 108. Although only one transistor is shown, it is understood that a device may include other device regions with transistors (not shown) or other suitable types of active or passive components/devices (not shown). Other configurations of devices may also be useful.

The support substrate 102 has a top surface 102a, and disposed in top surface 102a of support substrate 102 is a doped layer 130. In one embodiment, the doped layer includes alternating first and second polarity type regions 130a and 130b. First polarity type region 130a may be a p-type region and second polarity type region 130b may be an n-type region, or vice versa.

First and second polarity type regions 130a and 130b may be heavily doped regions having a dopant concentration of about, for example, $1\times10^{20}$-$1\times10^{22}$ atoms/$cm^3$ and a depth of about 200-400 Å from the top surface 102a. Other suitable dopant concentrations and depth dimensions may also be useful. As can be seen, first and second polarity type regions 130a and 130b are connected to redistribution layer (RDL) 160 disposed within support substrate 102 below first and second polarity type regions 130a and 130b. The heat which is built up in the top Si layer will be transferred through the insulator layer to the RDL as will be described in detail later.

Figure 1B:
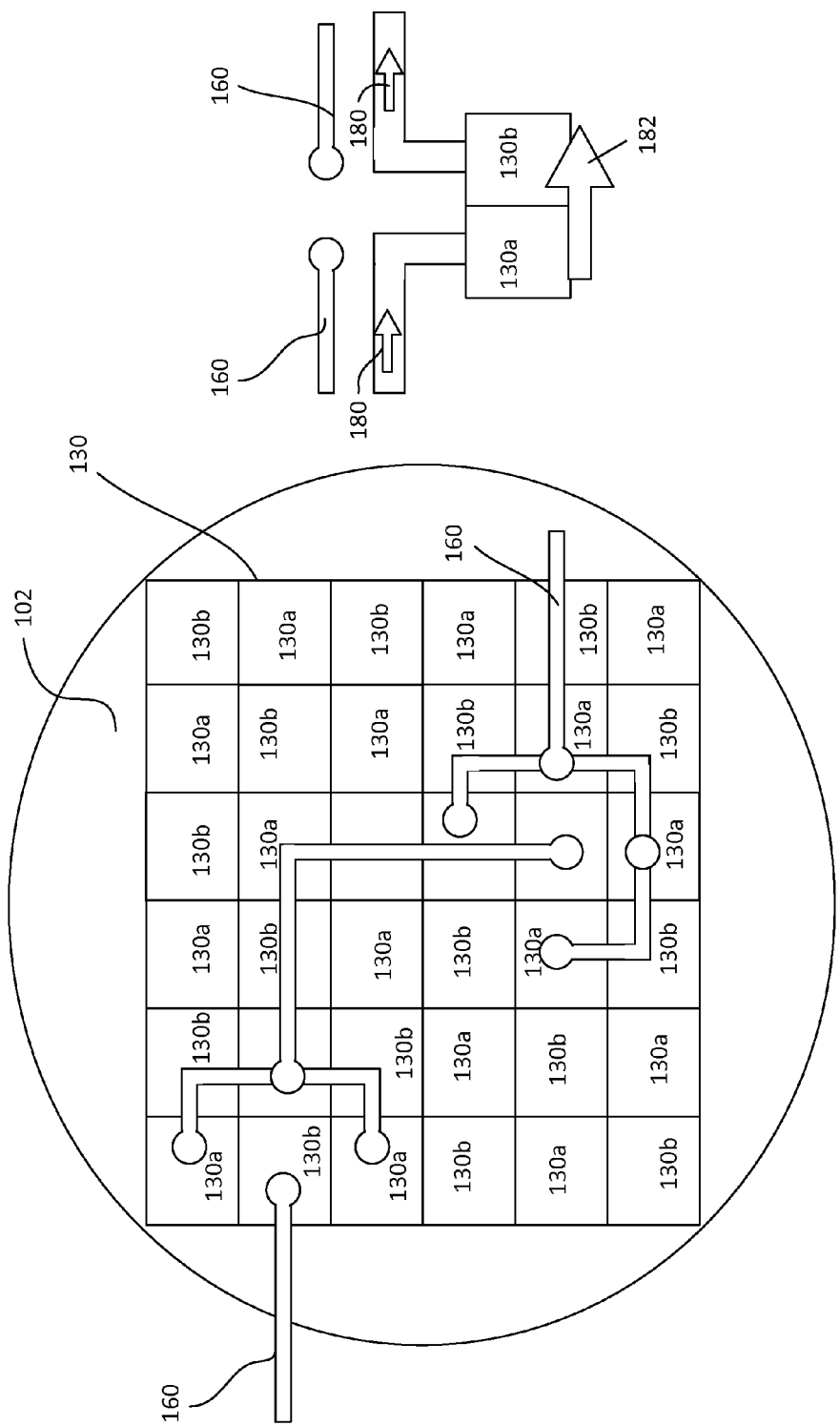

FIG. 1b shows a simplified top view and cross-sectional view of first and second polarity type regions 130a and 130b, which serve as the cooling device of substrate 101. As can be seen, several rows of a plurality of first and second polarity type regions 130a and 130b in alternating positions form a grid like configuration. The grid as shown includes a first row having three alternating sets of first polarity type region 130a to the left of the second polarity type region 130b in each set, and a second row having three alternating sets of second polarity type region 130b to the left of first polarity type region 130a in each set. The third and fifth rows of the grid mirror the first row while the fourth and sixth rows in the grid mirror the second row.

In other embodiments, there may be a different number of sets in a row, a different number of rows in the grid and/or a different arrangement of the first and second polarity type regions in the set as long as each first polarity type region is separated from the adjacent first polarity type region by a second polarity type region and vice versa. During the design phase, a hotspot check may be performed on IC 100 using thermal simulation but during the prototype phase, a hotspot check may be performed on IC 100 using liquid crystal hotspot detection or any other hotspot detection technique. Once the hotspots on substrate 101 are located or determined, backside electrical connection in RDL 160 which is made of, for example, Aluminum, will connect to the first or second polarity type region where the hotspot is located. The backside electrical connection in RDL may also be formed of any suitable conductive materials.

Referring to FIG. 1b, the hotspots and the adjacent cool-spots surrounding the hotspots are indicated by a circle at the end of the electrical connection. As can be seen from the cross-sectional view in FIG. 1b, the charge carrier flow 180 flows from the backside connection in RDL 160 to a first polarity type region with the hotspot and then flows to a cooler/non-hotspot, which may be any second polarity type region surrounding the hotspot, and flows out of the second polarity type region via its backside connection in RDL 160, thereby carrying the heat from these hotspots away from the wafer. The heat flow direction is indicated by arrow 182. As shown, thermoelectric cooling will apply to the hotspots found in the chip design. As shown in FIG. 1b, most of the non-hotspot regions will not be connected with backside connections in RDL. The exceptions are the non-hotspots adjacent to the hotspots. This in turn means that no electricity is wasted as only the hotspots are cooled.

Figure 2A:
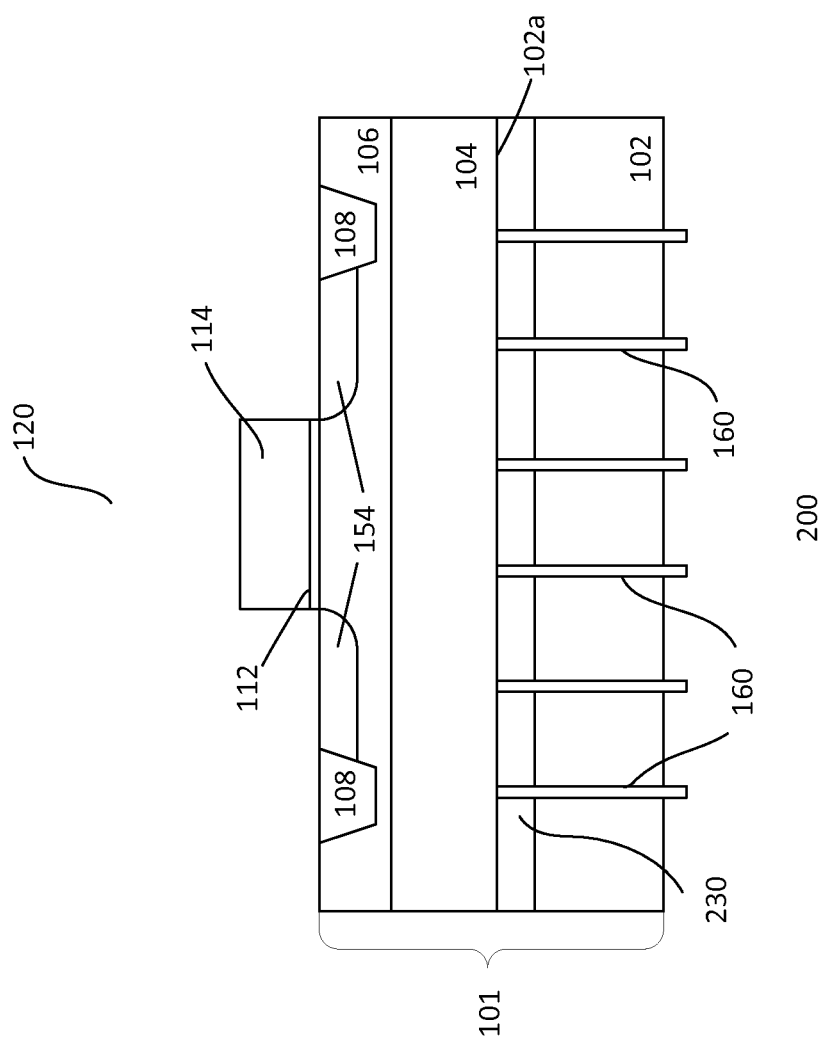
FIG. 2a shows cross-sectional view of another embodiment of an IC and FIG. 2b shows a simplified top view and cross-sectional view of another embodiment of a cooling device of the IC.

FIG. 2a shows a cross-sectional view of another embodiment of an IC 200. The IC, for example, is similar to that described in FIG. 1a. Common elements and features having the same reference numerals may not be described or described in detail. In the interest of brevity, the description of IC 200 below primarily focuses on the difference(s) between the IC of 200 and the IC of 100.

The IC 200 includes a substrate 101 which is the same as that shown in FIG. 1a. The substrate 101 includes a top surface layer 106 with the same active regions as shown in FIG. 1a; a support or "handle" substrate 102 and an insulator layer 104 isolating the top surface layer 106 from the support substrate 102. The materials for the substrate 101 and insulating layer 104 are the same as that described in FIG. 1a. The thickness of the insulator layer, for example, is about 1500 Å. Other suitable thicknesses and materials for the insulator layer 104 may also be useful.

The support substrate 102 has a top surface 102a. In one embodiment, disposed in top surface 102a of support substrate 102 is a doped layer 230. The doped layer 230 is different than the doped layer 130 in FIG. 1a. In one embodiment, the doped layer 230 as shown in FIG. 2a includes a single polarity type doped region or layer instead of alternating first and second polarity type regions 130a and 130b as shown in FIG. 1a. Doped layer 230 is preferably an n-doped layer. However, in another embodiment, using a p-doped layer may also be useful. Doped layer 230 may be a heavily doped region having a dopant concentration of about, for example, $1\times10^{20}$-$1\times10^{22}$ atoms/$cm^3$ and a depth of about 200-400 Å from the top surface 102a. Other suitable dopant concentration and depth dimension may also be useful.

Figure 2B:
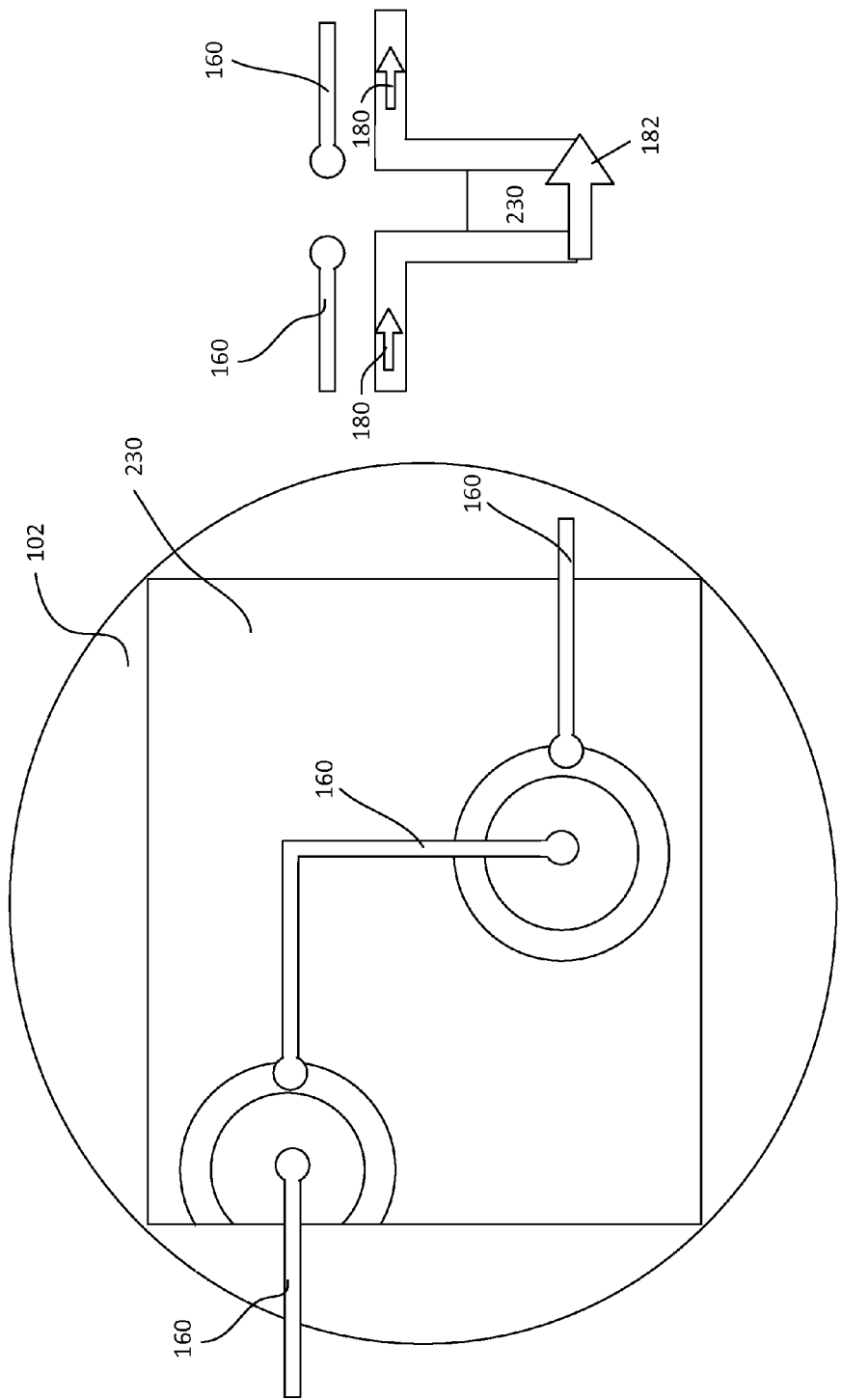

FIG. 2b shows a simplified top view and cross-sectional view of the doped layer 230 which serves as the cooling device of substrate 101 of IC 200. In this embodiment, once the location of the hotspots have been determined during the design phase, programming is done by selecting a hotspot in doped layer 230, which act as a cathode; and connecting it using backside electrical connection in RDL 160 which is formed of, for example, Aluminum layer, to adjacent cooler/non-hotspots surrounding the hotspot, which will act as an anode. Charge carrier flow 180 flows via the backside connection in RDL 160 from a cathode to an anode in the doped layer 230 and flows out of the anode via its backside connection in the RDL 160, thereby carrying the heat from these hotspots away from the wafer. The heat flow direction is indicated by arrow 182. Since a majority of the area in doped layer 230 is not connected and only the hotspots and its surrounding cooler/non-hotspots are connected, this means thermoelectric cooling will only occur at the hotspots and surrounding cooler/non-hotspots and hence, no electricity is wasted.

FIGS. 3a-3g show cross-sectional views of an embodiment of a process for forming an IC with the cooling device of FIGS. 1a-1b. As process 300 is employed in forming a device such as that shown in FIG. 1a; common elements and features having the same reference numerals may not be described or described in detail.

Referring to FIG. 3a, a support substrate 102 is provided. The support substrate 102 has a top surface 102a. For illustration, the support substrate 102 includes a semiconductor material. The semiconductor material, for example, includes single crystalline Si. Other suitable types of substrate materials or any other suitable semiconductor materials may also be useful. The thickness of the support substrate, for example, is about 700 μm. Other suitable thicknesses may also be useful.

The process continues to form a doped layer 130 in a top portion of the support substrate. As shown, the top surface 102a of support substrate 102 is covered by a mask layer 342. The mask layer, for example, includes a patterned resist layer. The mask layer includes a plurality of openings to expose portions of the top surface of the support substrate. Exposed regions of the support substrate are subject to a first polarity type implant 352, such as p-type dopant implant, to form first polarity type regions 130a. Implanting the exposed areas with n-type dopants may also be useful. The p-type dopant implant may have a dopant concentration of about, for example, $1\times10^{20}$-$1\times10^{22}$ atoms/cm$^3$ and a depth of about 200-400 Å from the top surface 102a. Other suitable dopant concentration and depth dimensions may also be useful.

Referring to FIG. 3b, the top surface 102a of support substrate 102 is covered by a second mask layer 344, which covers the first polarity type regions 130a and includes a plurality of openings which expose portions of the top surface of the support substrate adjacent to the first polarity type regions. The exposed area is then subject to a second polarity type implant 354, such as n-type dopant implant, to form second polarity type regions 130b. Implanting the exposed areas with p-type dopants may also be useful. The n-type dopant implant may have a dopant concentration of about, for example, $1\times10^{20}$-$1\times10^{22}$ atoms/cm$^3$ and a depth of about 200-400 Å from the top surface 102a. Other suitable dopant concentration and depth dimensions may also be useful.

Figure 3C:
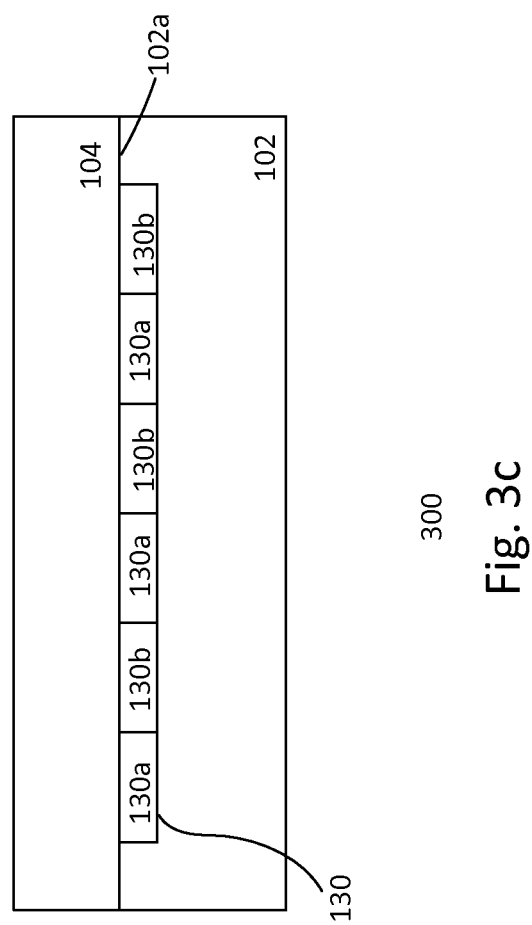

Referring to FIG. 3c, the previous first and second polarity type implants have formed a plurality of first polarity type regions 130a separated by second polarity type regions 130b that are disposed in the top surface 102a of support substrate 102. In addition, an insulator layer 104 is formed over the top surface 102a of support substrate 102. Insulator layer 104, for example, includes a dielectric insulating material. Other suitable types of dielectric insulating materials may also be useful.

Various techniques, such as H implant or thermal oxidation using furnace annealing, may be employed to form the insulator layer. The thickness of the insulator layer 104, for example, is about 1500 Å. Other suitable thicknesses and materials and techniques for forming the insulator layer 104 may also be useful.

Figure 3D:
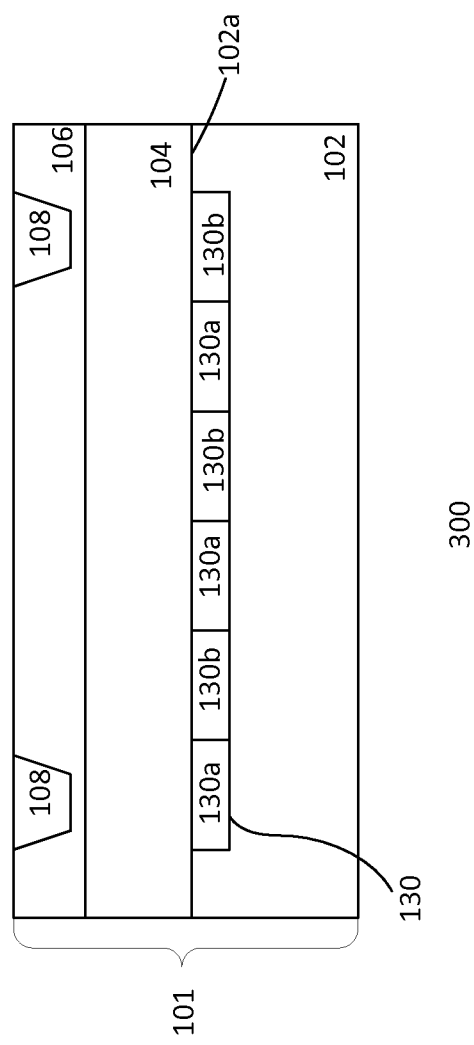

FIG. 3d shows that a top surface layer 106 is formed on the insulator layer 104. The top surface layer 106 may include a semiconductor material. The semiconductor material, for example, includes single crystalline Si. In this case, the top surface layer may be referred to as the top Si layer and the substrate 101 is a SOI substrate. Other suitable types of substrate materials or any other suitable semiconductor materials may also be useful. In one embodiment, the top surface layer and the support substrate include the same material. Providing different materials for the top surface layer and the support substrate may also be useful. The thickness of the top surface layer, for example, is about 500 Å. Other suitable thicknesses may also be useful.

The top surface layer is processed to form isolation regions 108. The isolation regions are, for example, shallow trench isolation (STI) regions. In one embodiment, the STI regions extend from top surface of the top Si layer to a portion of the top Si layer. Various processes can be employed to form the STI regions. For example, the top Si layer of the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI regions. In other embodiments, the isolation regions may be other types of isolation regions.

Figure 3E:
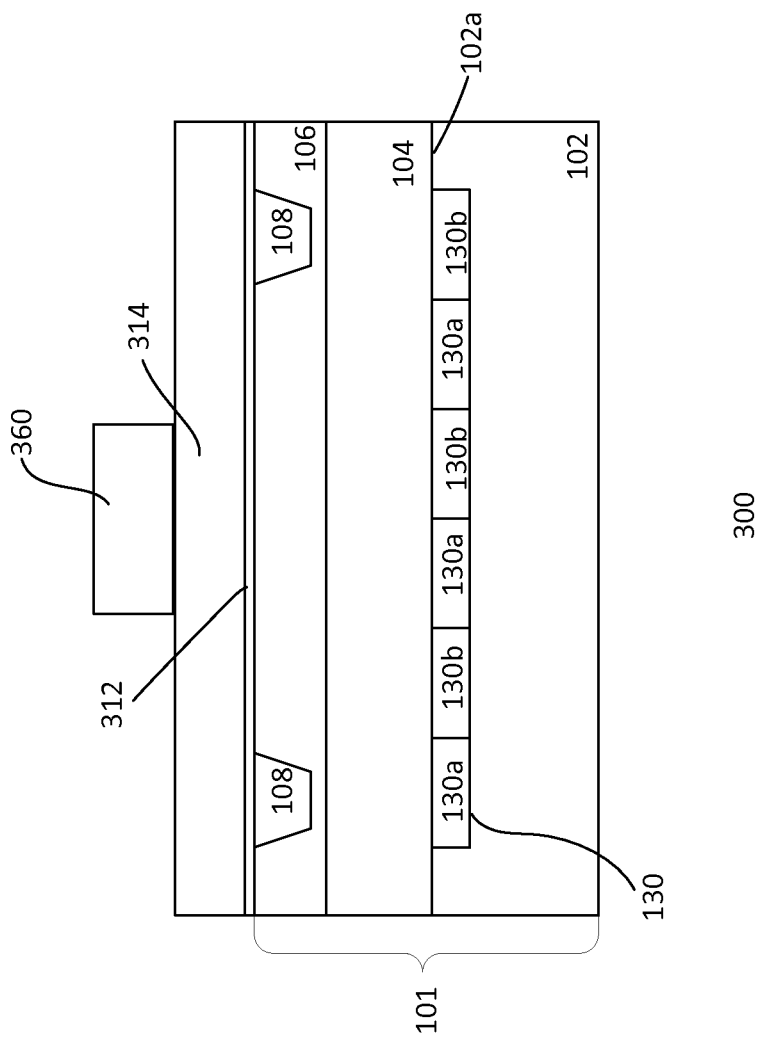
Figure 3F:
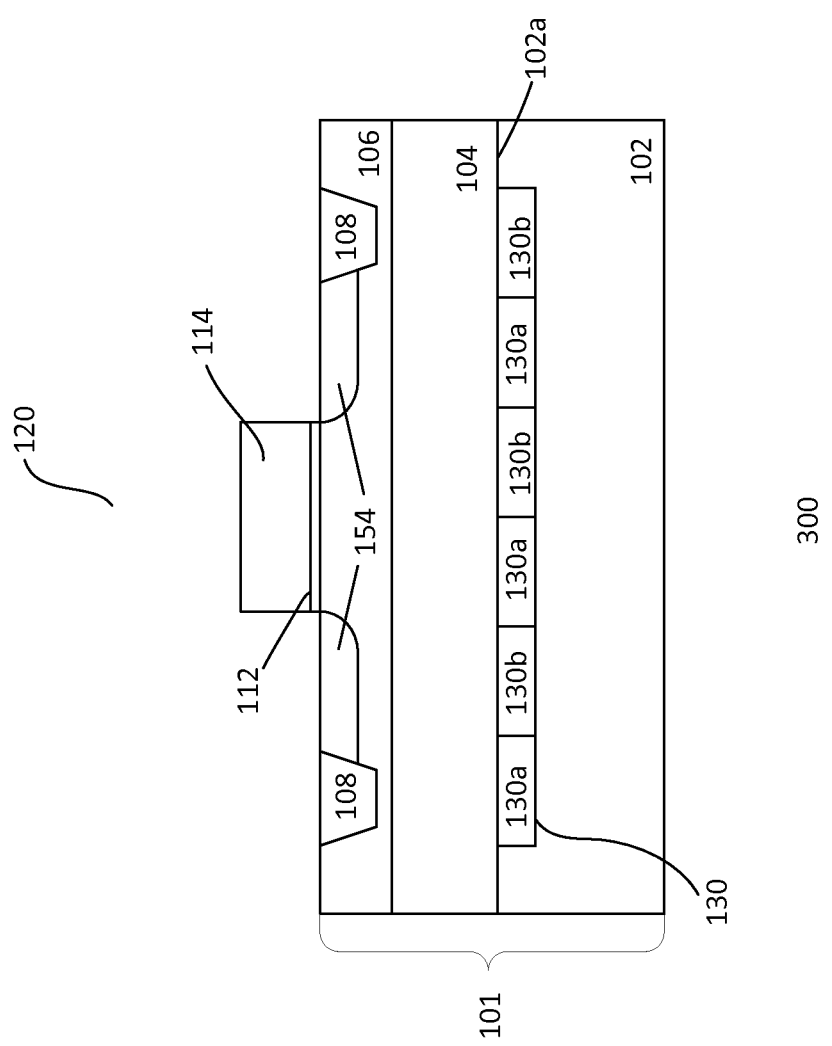

Referring to FIG. 3e, a gate dielectric layer 312 is formed on the top surface layer 106 and a gate electrode layer 314 is formed over the gate dielectric layer 312. The gate dielectric layer, for example, includes silicon oxide while the gate electrode layer, for example, includes a polysilicon layer. The gate dielectric layer may be formed by thermal oxidation while the gate electrode layer may be formed by chemical vapor deposition (CVD) process. Other suitable types of materials and forming techniques may be employed for the gate dielectric and electrode layers. The gate dielectric layer 312 and gate electrode layer 314 are patterned by a mask layer 360 to form a gate of a transistor 120 as shown in FIG. 3f. The gate of the transistor includes a gate dielectric 112 and a gate electrode 114 thereon.

FIG. 3f also shows the formation of heavily doped diffusion regions 154 adjacent to sidewalls of the gate in the top surface layer 106. The heavily doped regions, for example, serve as the source/drain (S/D) regions of the transistor. The heavily doped regions, for example, have first polarity type dopants for a first polarity type transistor. Forming the heavily doped regions includes implanting first polarity type dopants into the top Si layer of the substrate. For example, the implant may be introduced into the substrate using an implant mask. The depth of the heavily doped diffusion regions, for example, is about hundreds to thousands Å. The implant dose may be about 1E14-9E15/cm$^2$ and the implant energy may be several to tens of keV. Other suitable implant parameters may also be used to form the heavily doped diffusion regions. This forms a transistor 120. Although only one transistor is shown, it is understood that there could be more than one transistors formed on the same substrate. Furthermore, it is also understood that the process may also include forming lightly doped diffusion regions in the top surface layer and sidewall spacers on sidewalls of the gate and forming other suitable active or passive component/devices (not shown).

The process may continue to form an interlevel dielectric (ILD) layer (not shown) over the top surface layer 106. The ILD layer, for example, serves as a pre-metal dielectric (PMD) layer. The process may continue to form contacts which are coupled to contact regions, such as S/D regions and gate followed by back-end-of-line (BEOL) process. The BEOL process includes forming interconnect metal levels having a plurality of low-k dielectric layers which includes interconnections coupled to the terminals of the transistor and other circuit components, as desired.

Figure 3G:
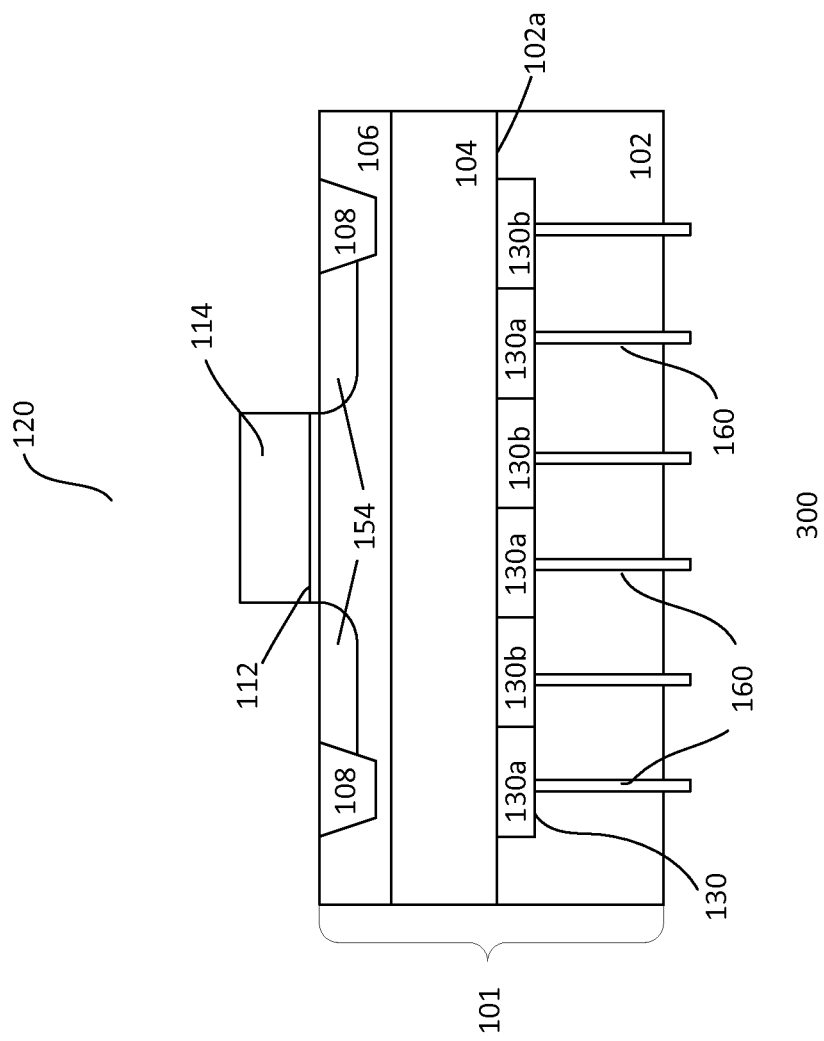

The process may continue to perform a removal process to reduce the thickness of the support substrate. For example, a backgrinding process may be performed to reduce the thickness of the support substrate to a desired thickness. FIG. 3g shows the formation of redistribution layer (RDL) 160 for connecting to hotspots in the first and second polarity type regions. The RDL 160 is formed by the addition of metal and dielectric layers onto the surface of the substrate to re-route the input/output (I/O) layout into a new, looser pitch footprint. While RDL 160 is formed based on the locations of the hotspots and surrounding cooler/non-hotspots, it may also be used in the bumping process in order to connect the chips; as such, this results in the saving of process steps.

Figure 4A:
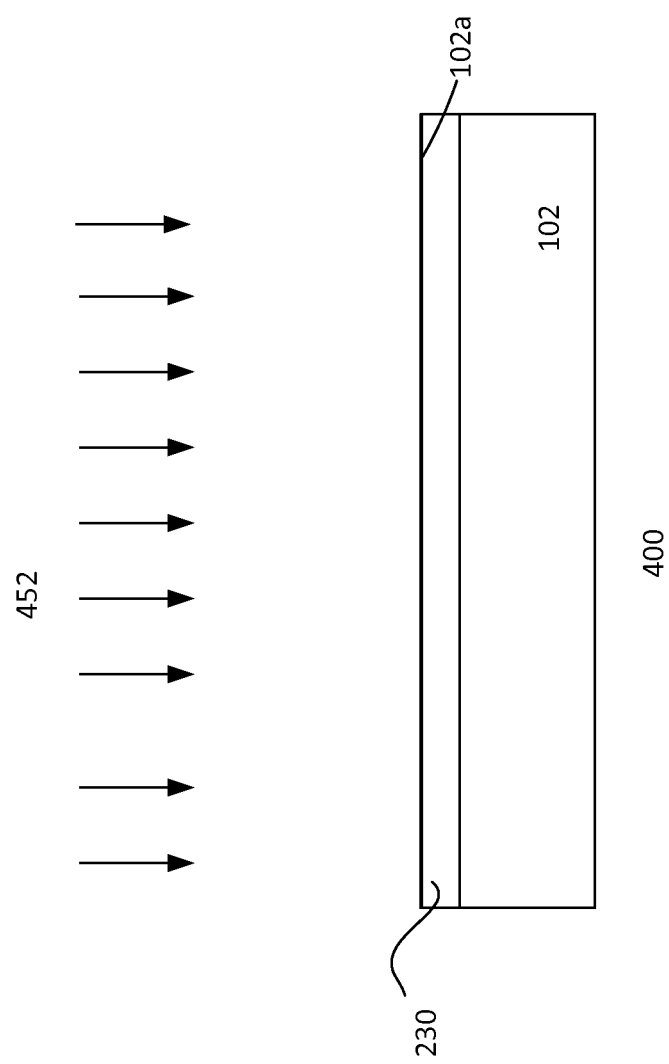
FIGS. 4a-4b show cross-sectional views of another embodiment of a process for forming an IC with the cooling device of FIGS. 2a-2b.
Figure 4B:
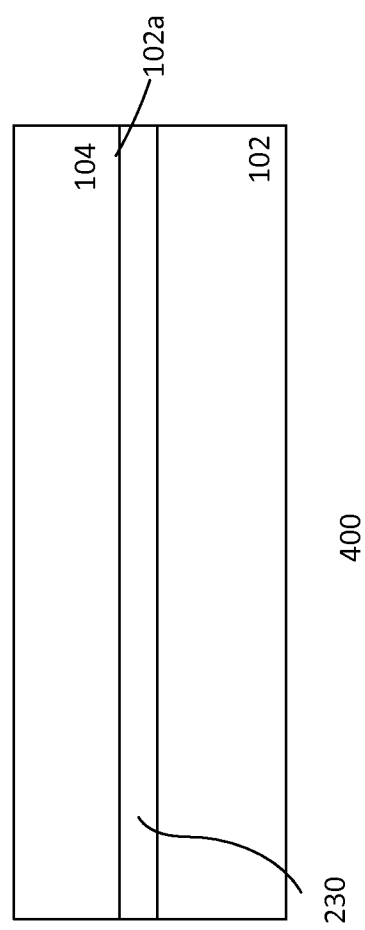

FIGS. 4a-4b show cross-sectional views of another embodiment of a process for forming an IC with the cooling device of FIGS. 2a-2b. As the process 400 is employed in forming an IC with cooling device such as that shown in FIG. 2a, common elements and features having the same reference numerals may not be described or described in detail.

Referring to FIG. 4a, a support substrate 102 is provided. The support substrate 102 has a top surface 102a. The support substrate 102 includes a semiconductor material. The semiconductor material, for example, includes single crystalline Si. Other suitable types of substrate materials or any other suitable semiconductor materials may also be useful. The thickness of the support substrate, for example, is about 700 μm. Other suitable thicknesses may also be useful.

The process continues to form a doped layer 230. As shown, the top surface 102a of support substrate 102 is subject to a first polarity type implant 452. For example, the entire top surface of the support substrate is subject to the first polarity type implant. The first polarity type is preferably n-type, but implanting the top surface 102a with p-type dopants may also be useful. The n-type dopant implant may have a dopant concentration of about, for example, $1\times10^{20}$-$1\times10^{22}$ atoms/cm$^3$ and a depth of about 200-400 Å from the top surface 102a, thereby forming a n-type doped layer 230 in a top portion of the support substrate 102. Other suitable dopant concentrations and depth dimensions may also be useful.

Referring to FIG. 4b, an insulator layer 104 is former over the doped layer 230. Various techniques, such as H implant or thermal oxidation using furnace annealing, may be employed to form the insulator layer 104. The thickness of the insulator layer 104, for example, is about 1500 Å. Other suitable thicknesses and materials and techniques for forming the insulator layer 104 may also be useful.

The process continues to form additional layers and features such as that shown from FIG. 3d and onwards until a device shown in FIG. 2a is formed. As in process 300, process 400 also includes the formation of RDL (not shown) for connecting to hotspots in n-doped layer 230. The BEOL metallization is formed on top of the silicon while the RDL is formed on the back of the substrate.

The embodiments as described in this disclosure result in advantages. The cooling device shown in FIGS. 1a and 2a is a programmable active cooling device for the SOI substrate. The cooling device reduces self-heating of the SOI substrate, thus improving the device performance. In addition, the cooling device as described above cools just the hotspots on the substrate to reduce usage of electricity and achieving cost savings. For example, through dedicated backside electrical connection RDL design, the thermoelectric cooling will only apply to the hotspots and surrounding cooler/non-hotspots found in the chip design. As such, most of the non-hotspot regions will not be connected with backside connection in RDL. This means that no electricity is wasted as only the hotspots are cooled. Moreover, the hotspots are checked or determined during design phase or prototype phase. Therefore, the inclusion of the dedicated backside electrical connection has total independency of the design cycle.

Furthermore, the cooling device is formed on the support substrate which is located at the back of the top surface layer of the SOI substrate. Such arrangement of the cooling device is more effective relative to if the cooling device were to be provided on top of the interconnect metal layers after the BEOL process. This is because, by providing the cooling device at the backside of the IC, the heat travel path is shortened as the insulator layer of the SOI substrate is much thinner than the low-k dielectric layers of the interconnect metal levels formed by the BEOL process on top of IC. Hence, such arrangement of cooling device provides for better thermal conduction and electrical insulation.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An integrated circuit (IC) comprising:
   a single silicon-on-insulator (SOI) substrate comprises a top surface layer facing an upward direction, a support substrate serving as a base of the single SOI substrate and an insulator layer isolating the top surface layer from the support substrate;
   at least one device disposed in the top surface layer of the single SOI substrate;
   a cooling device comprises a doped layer disposed in a top surface of the support substrate; and
   a RDL layer disposed within the support substrate below the doped layer for providing connections to hotspots in the doped layer to facilitate thermoelectric conduction of heat in the hotspots away from the IC.

2. The IC of claim 1 wherein the doped layer comprises alternating first and second polarity type regions.

3. The IC of claim 2 wherein the alternating first and second polarity type regions are heavily doped regions having a dopant concentration of about $1\times10^{20}$-$1\times10^{22}$ atoms/cm$^3$.

4. The IC of claim 1 wherein the doped layer comprises a single polarity type doped region.

5. The IC of claim 4 wherein the single polarity typed region is a heavily doped region having a dopant concentration of about $1\times10^{20}$-$1\times10^{22}$ atoms/cm$^3$.

6. The IC of claim 1 wherein the insulator layer comprises a buried oxide (BOX) layer, and wherein the top surface layer of the single SOI substrate and the support substrate comprise different materials.

7. The IC of claim 1 wherein backside electrical connection in the RDL layer is provided only to the hotspots and surrounding cooler spots in the doped layer.

8. The IC of claim 7 wherein the hotspots are determined by performing a hotspot check during a design phase using thermal insulation.

9. The IC of claim 7 wherein the hotspots are determined by performing a hotspot check during a prototype phase using hotspot detection technique which comprises liquid crystal hotspot detection.

10. The IC of claim 7 wherein a charge carrier flow flows from the backside connection in the RDL layer to a hotspot region and then flows to a surrounding cooler spot region, and out of the cooler spoft region via its backside connection in the RDL layer, thereby carrying the heat from these hotspots away from the IC .

11. A method for forming an integrated circuit (IC) comprising:
   forming a single silicon-on-insulator (SOI) substrate by first forming a support substrate having a top surface;
   forming a doped layer in the top surface of the support substrate;
   forming an insulator layer of the single SOI substrate over the top surface of the support substrate, wherein the insulator layer comprises a buried oxide (BOX) layer;
   forming a top surface layer of the single SOI substrate on the insulator layer, wherein the top surface layer includes at least a device and faces an upward direction; and
   forming a redistribution layer (RDL) within the support substrate below the doped layer for connecting to hotspots in the doped layer to facilitate thermoelectric conduction of heat in the hotspots away from the IC thereby reducing self-heating of the IC.

12. The method of claim 11 wherein the insulator is formed by H implant or thermal oxidation using furnace annealing.

13. The method of claim 11 wherein forming the doped layer comprises:
   providing a first mask layer having a plurality of openings to expose portions of the top surface of the support substrate;
   subjecting exposed portions of the top surface of the support substrate to a first polarity type implant to form first polarity type regions;
   providing a second mask layer which covers the first polarity type regions and includes a plurality of openings which expose portions of the top surface of the support substrate adjacent to the first polarity type regions; and
   subjecting the exposed portions adjacent to the first polarity type regions to a second polarity type implant to form second polarity type regions, thereby forming a plurality of first polarity type regions separated by second polarity type regions that are formed in the top surface of the support substrate.

14. The method of claim 13 wherein the first and second polarity type regions have a dopant concentration of about $1 \times 10^{20}$-$1 \times 10^{22}$ atoms/cm$^3$ and a depth of about 200-400 Å from the top surface of the support substrate.

15. The method of claim 11 wherein forming the doped layer comprises subjecting the entire top surface of the support substrate to a first polarity type implant.

16. The method of claim 15 wherein the first polarity type is n-type and the n-type dopant implant has a dopant concentration of about $1 \times 10^{20}$-$1 \times 10^{22}$ atoms/cm$^3$ and a depth of about 200-400 Å from the top surface of the support substrate, thereby forming an n-type doped layer in the top portion of the support substrate.

17. The method of claim 11 wherein forming the RDL layer comprises forming dedicated backside electrical connection only to hotspots and surrounding cooler spots found in chip design.

18. The method of claim 17 wherein the hotspots are determined during a design phase or a prototype phase.

19. The method of claim 11 comprising:
   first forming an interlevel dielectric (ILD) layer over the top surface layer on the insulator layer;
   then forming contacts which are coupled to contact regions which comprises source/drain (S/D) regions and gate;
   then performing a back-end-of-line (BEOL) process; and
   finally performing a removal process to reduce thickness of the support substrate to a desired thickness.

20. A method for cooling an integrated circuit (IC) comprising:
   providing a single silicon-on-insulator (SOI) substrate, the SOI substrate includes
      a top surface layer,
      a support substrate serving as a base of the single SOI substrate, and
      an insulator layer disposed between the top surface layer and the support substrate;
   forming at least one device in the top surface layer of the single SOI substrate;
   forming a cooling device in a support substrate that is a base substrate of the single SOI substrate, wherein the cooling device comprises a doped layer disposed in a surface of the support substrate adjacent to the insulator layer; and
   forming a RDL layer, the RDL layer is disposed within the support substrate below the doped layer for providing connections to hotspots in the doped layer to facilitate thermoelectric conduction of heat in the hotspots away from the IC.

* * * * *